United States Patent
Nakamiya et al.

(10) Patent No.: US 11,657,841 B2
(45) Date of Patent: May 23, 2023

(54) FLEXIBLE PRINTED CIRCUIT OFFSET FINGER STIFFENER

(71) Applicant: Western Digital Technologies, Inc., San Jose, CA (US)

(72) Inventors: Teruhiro Nakamiya, Setagaya-ku (JP); Kazuhiro Nagaoka, Fujisawa (JP); Satoshi Nakamura, Yokohama (JP); Nobuyuki Okunaga, Kawasaki (JP)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/356,277

(22) Filed: Jun. 23, 2021

(65) Prior Publication Data
US 2022/0415346 A1 Dec. 29, 2022

(51) Int. Cl.
*G11B 5/48* (2006.01)
*G11B 5/596* (2006.01)
*H05K 1/02* (2006.01)

(52) U.S. Cl.
CPC ............ *G11B 5/486* (2013.01); *G11B 5/4846* (2013.01); *G11B 5/59605* (2013.01); *H05K 1/0201* (2013.01); *H05K 1/0209* (2013.01)

(58) Field of Classification Search
None
See application file for complete search history.

(56) References Cited

U.S. PATENT DOCUMENTS

| 6,212,046 B1 * | 4/2001 | Albrecht ............. G11B 5/4846 360/264.2 |
| 8,068,314 B1 * | 11/2011 | Pan ..................... G11B 5/4846 360/245.9 |
| 8,295,013 B1 | 10/2012 | Pan et al. |
| 8,422,171 B1 | 4/2013 | Guerini |

(Continued)

FOREIGN PATENT DOCUMENTS

| CN | 102202458 A | 9/2011 |
| CN | 110289021 A * | 9/2019 |

(Continued)

OTHER PUBLICATIONS

Kynix Semiconductor Limited, Structures and Applications of the FPCB, 12 pages, downloaded from http://www.kynixsemiconductor.com/News/71.html, as early as Apr. 19, 2021.

(Continued)

*Primary Examiner* — Craig A. Renner
(74) *Attorney, Agent, or Firm* — John D. Henkhaus

(57) ABSTRACT

A hard disk drive flexible printed circuit (FPC) includes a plurality of fingers extending from a main portion, with each finger having a thermally-conductive stiffener, at least one wiring layer over the stiffener, and a cover film over the at least one wiring layer, where the centroid of the stiffener is offset from the centerline of the cover film. Thus, utilizing the heat-sink characteristics of the stiffener, temperature differences among the upper and lower electrical pads of the FPC resulting from a heat-based interconnection procedure can be reduced and the temperatures across the FPC finger made more uniform, damage to the FPC prevented, and soldering yields improved.

20 Claims, 9 Drawing Sheets

(56) References Cited

U.S. PATENT DOCUMENTS

| | | | |
|---|---|---|---|
| 8,611,052 B1* | 12/2013 | Pan | G11B 5/4813 |
| | | | 360/264.2 |
| 8,760,812 B1* | 6/2014 | Chen | G11B 5/4846 |
| | | | 360/244.1 |
| 8,941,952 B1 | 1/2015 | Pan et al. | |
| 9,972,347 B1* | 5/2018 | Pan | G11B 5/84 |
| 9,997,183 B2 | 6/2018 | Miller et al. | |
| 11,257,515 B1* | 2/2022 | Sato | G11B 25/043 |
| 11,483,928 B2* | 10/2022 | Adachi | H05K 1/0281 |
| 2005/0013055 A1 | 1/2005 | Ho et al. | |
| 2007/0153427 A1* | 7/2007 | Izumi | G11B 5/4846 |
| | | | 360/264.2 |
| 2010/0252307 A1* | 10/2010 | Mo | H05K 1/0281 |
| | | | 174/254 |
| 2020/0305280 A1* | 9/2020 | Tokuda | H05K 1/118 |
| 2021/0076506 A1* | 3/2021 | Yoshikawa | H05K 3/323 |
| 2021/0090595 A1* | 3/2021 | Sato | H05K 1/116 |
| 2021/0272593 A1* | 9/2021 | Tokizaki | G11B 5/4846 |

FOREIGN PATENT DOCUMENTS

| | | |
|---|---|---|
| EP | 1950740 A2 | 7/2008 |
| JP | H01153326 U * | 10/1989 |
| JP | 2003527718 A | 9/2003 |
| JP | 2007323703 A | 12/2007 |
| JP | 2012119031 A | 6/2012 |
| JP | 2019008861 A | 1/2019 |
| WO | WO 2006054649 A1 * | 5/2006 |

OTHER PUBLICATIONS

Kanehiro, Masayuki, et al., Development of Sumitomo Electric's Flexible Printed Circuit Business, Apr. 2008, pp. 4-13, SEI Technical Review, No. 66.

* cited by examiner

FLEXIBLE PRINTED CIRCUIT OFFSET FINGER STIFFENER

FIELD OF EMBODIMENTS

Embodiments of the invention may relate generally to hard disk drives, and particularly to approaches to providing substantially uniform temperature across flexible printed circuit (FPC) electrical pads during interconnecting procedure.

BACKGROUND

A hard disk drive (HDD) is a non-volatile storage device that is housed in a protective enclosure and stores digitally encoded data on one or more circular disks having magnetic surfaces. When an HDD is in operation, each magnetic-recording disk is rapidly rotated by a spindle system. Data is read from and written to a magnetic-recording disk using a read-write head (or "transducer") that is positioned over a specific location of a disk by an actuator. A read-write head makes use of magnetic fields to write data to and read data from the surface of a magnetic-recording disk. A write head works by using the current flowing through its coil to produce a magnetic field. Electrical pulses are sent to the write head, with different patterns of positive and negative currents. The current in the coil of the write head produces a localized magnetic field across the gap between the head and the magnetic disk, which in turn magnetizes a small area on the recording medium.

To write data to the medium, or to read data from the medium, the head has to receive instructions from a controller. Hence, the head is connected to the controller in some electrical manner so that not only does the head receive instructions to read/write data, but the head can also send information back to the controller regarding the data read and/or written. Typically, a flexible printed circuit (FPC) is used to electrically transmit signals from the read-write head via a suspension tail to other electronics within an HDD. The FPC and the suspension tail are typically soldered together at a comb or "E-block" portion (see, e.g., carriage 134 of FIG. 1) of a head-stack assembly (HSA). To connect them with solder, the suspension electrical pads and the FPC electrical pads are heated. If the soldering temperature is low the solder may not melt, whereas if the soldering temperature is high these components may be damaged by the heat. Thus, it is desirable to heat these components uniformly to avoid generating significant temperature differences among the various pads. Otherwise, the corresponding electrical interconnections may be compromised, which can lead to compromised flow of data to/from the head.

Any approaches that may be described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

Embodiments are illustrated by way of example, and not by way of limitation, in the figures of the accompanying drawings and in which like reference numerals refer to similar elements and in which.

DETAILED DESCRIPTION

Generally, approaches to providing substantially uniform temperature across flexible printed circuit (FPC) electrical pads during an interconnecting procedure, are described. In the following description, for the purposes of explanation, numerous specific details are set forth in order to provide a thorough understanding of the embodiments of the invention described herein. It will be apparent, however, that the embodiments of the invention described herein may be practiced without these specific details. In other instances, well-known structures and devices may be shown in block diagram form in order to avoid unnecessarily obscuring the embodiments of the invention described herein.

INTRODUCTION

Terminology

References herein to "an embodiment", "one embodiment", and the like, are intended to mean that the particular feature, structure, or characteristic being described is included in at least one embodiment of the invention. However, instances of such phrases do not necessarily all refer to the same embodiment, The term "substantially" will be understood to describe a feature that is largely or nearly structured, configured, dimensioned, etc., but with which manufacturing tolerances and the like may in practice result in a situation in which the structure, configuration, dimension, etc. is not always or necessarily precisely as stated. For example, describing a structure as "substantially vertical" would assign that term its plain meaning, such that the sidewall is vertical for all practical purposes but may not be precisely at 90 degrees throughout.

While terms such as "optimal", "optimize", "minimal", "minimize", "maximal", "maximize", and the like may not have certain values associated therewith, if such terms are used herein the intent is that one of ordinary skill in the art would understand such terms to include affecting a value, parameter, metric, and the like in a beneficial direction consistent with the totality of this disclosure. For example, describing a value of something as "minimal" does not require that the value actually be equal to some theoretical minimum (e.g., zero), but should be understood in a practical sense in that a corresponding goal would be to move the value in a beneficial direction toward a theoretical minimum.

CONTEXT

At a distal end of the suspension, there is a read-write transducer (or "head") to read and write data. At the other proximal end of the suspension, there are electrically conductive pads (or simply "electrical pads") to electrically connect to corresponding electrically conductive pads on a flexible printed circuit (FPC). The suspension pads and the FPC pads are electrically interconnected (orthogonally in this instance), typically with solder.

Figure 1:
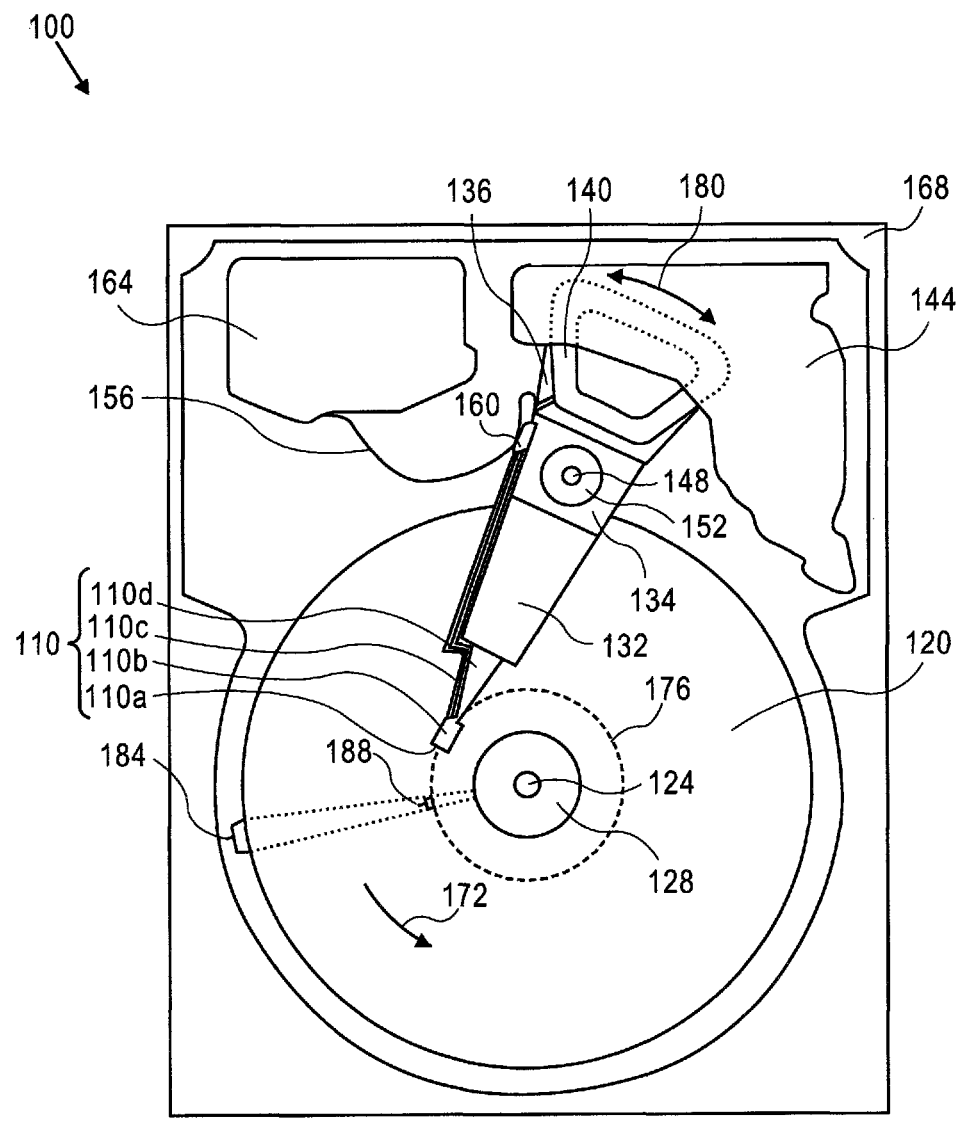
FIG. 1 is a plan view illustrating a hard disk drive, according to an embodiment.
Figure 2A:
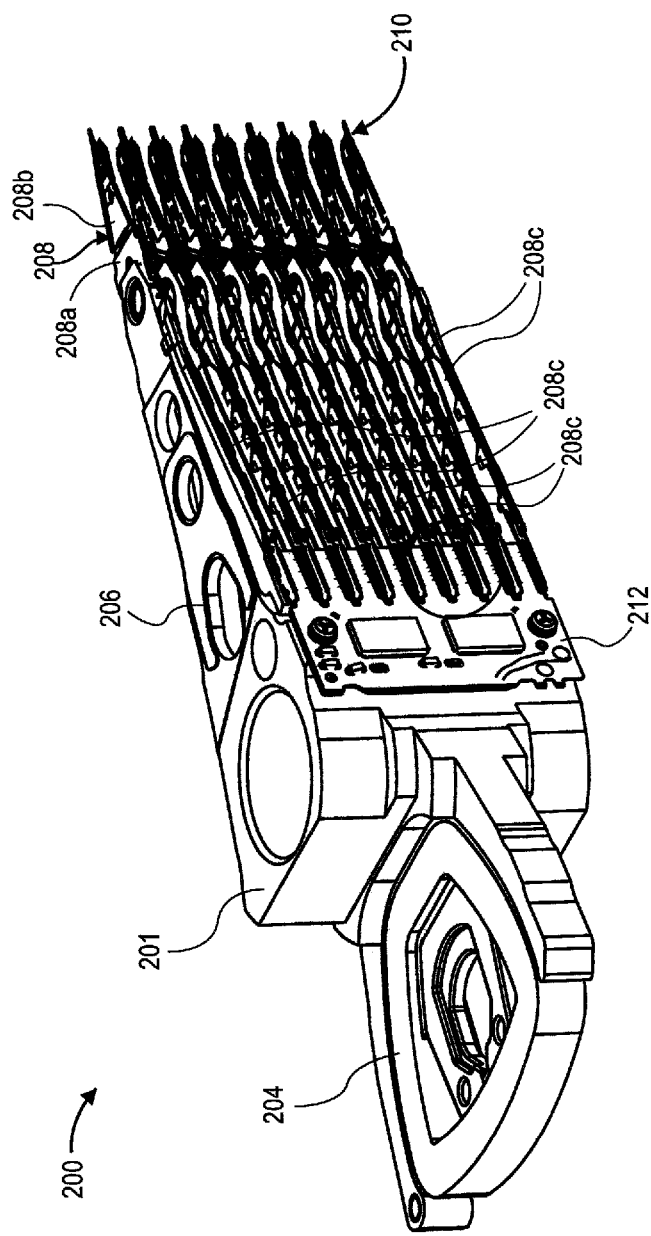
FIG. 2A is a perspective view illustrating an actuator assembly, according to an embodiment.

FIG. 2A is a perspective view illustrating an actuator assembly, according to an embodiment. Actuator assembly 200 comprises a carriage 201 (see, e.g., carriage 134 of FIG. 1) rotatably coupled with a central pivot shaft (not shown here; see, e.g., pivot shaft 148 of FIG. 1) by way of a pivot bearing assembly (not shown here; see, e.g., pivot bearing assembly 152 of FIG. 1), and rotationally driven by a voice coil motor (VCM), of which a voice coil 204 is illustrated here. Actuator assembly 200 further comprises one or more actuator arm 206 (see, e.g., arm 132 of FIG. 1), to each of which is coupled a suspension assembly 208 (see, e.g., lead suspension 110c of FIG. 1) housing a read-write head 210 (see, e.g., read-write head 110a of FIG. 1), and typically comprising a swaged baseplate 208a, a load beam 208b (see, e.g., load beam 110d of FIG. 1), and a suspension tail 208c. Each suspension assembly 208 is electrically connected with a flexible printed circuit (FPC) 212 coupled with the carriage 201, by way of suspension tail 208c.

Figure 2B:
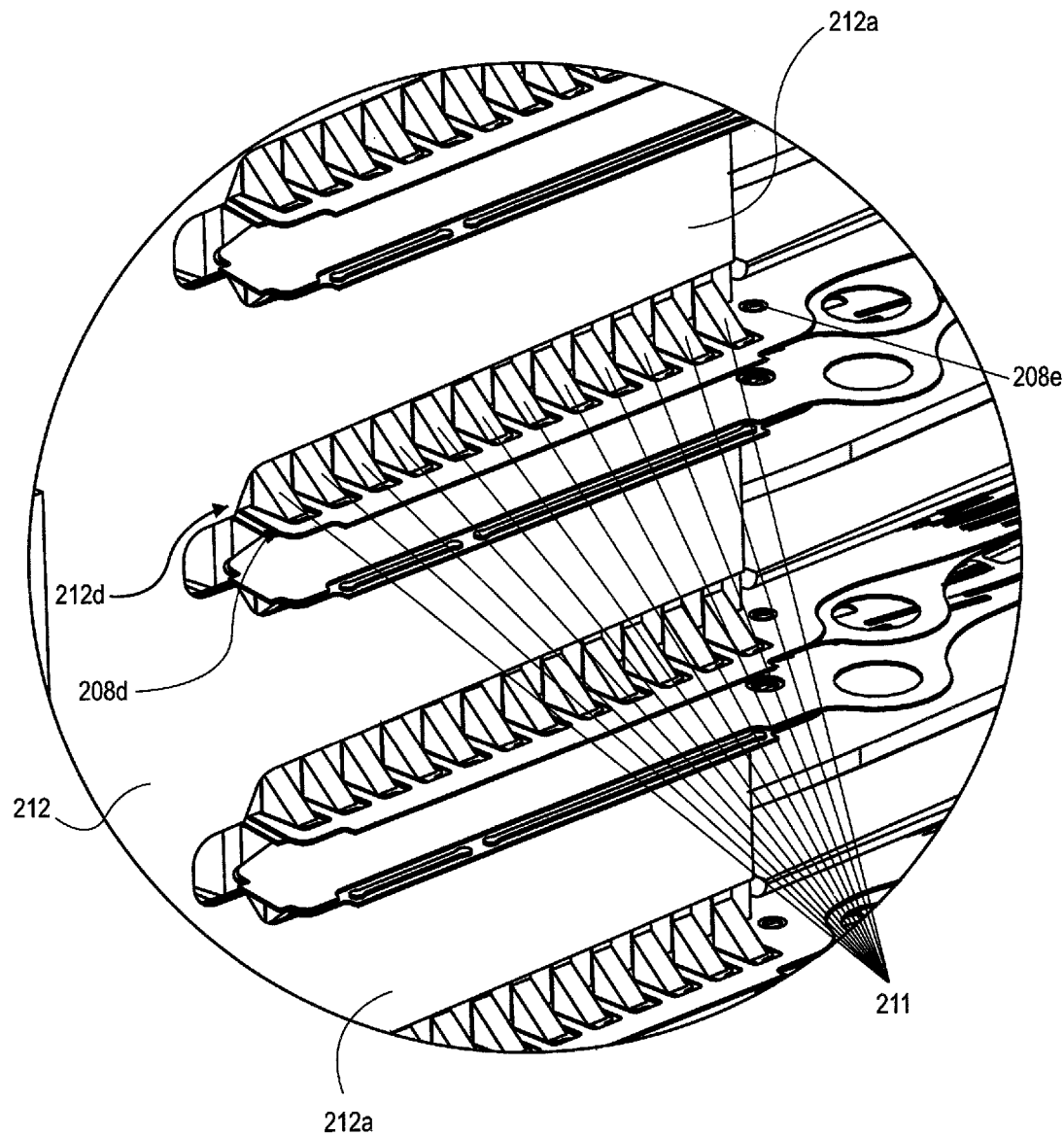
FIG. 2B is a perspective view illustrating an electrical interconnection between a suspension tail and a flexible printed circuit (FPC), according to an embodiment.

FIG. 2B is a perspective view illustrating an electrical interconnection between a suspension tail and a flexible printed circuit (FPC), according to an embodiment. FIG. 2B depicts a suspension tail tip 208e of the suspension tail 208c (FIG. 2A) mechanically and electrically coupled to a corresponding FPC finger 212a of the FPC 212, by way of solder 211 (or some other electrical connection means). Particularly, electrical pads 208d on the suspension tail tip 208e are electrically connected to electrical pads 212d of the FPC 212. Recall that with soldering and other similar connection techniques, the suspension electrical pads and the FPC electrical pads are heated, and if the soldering temperature is too low then the solder may not melt and if the soldering temperature is too high then the FPC may be damaged by the heat. Typically, solder reflow, hot air, or a laser may be used to heat the materials in the soldering procedure.

There may be various scenarios that lead to an asymmetric configuration between the upper electrical pads 212d and their corresponding traces and the lower electrical pads 212d and their corresponding traces, which can lead to significant temperature differences between the upper and lower portions of the FPC finger 212a. For a non-limiting example, in the context of using common head sliders for both UP and DN read-write heads, which could result in the head pad layout being reversed rather than mirrored as with mirrored UP and DN heads, the corresponding pad layout for the FPC 212 and likewise the FPC finger 212a trace wiring layout are also not mirrored between the upper electrical pads 212d and their corresponding traces and the lower electrical pads 212d and their corresponding traces. Thus, the temperature differences between some UP and DN pad 212d pairs (e.g., manifesting as temperature differences between upper and lower portions of the FPC finger 212a), as well as temperature differences along either or both lines of pads 212d, may become significant enough to the point of being deleterious to one or more of the electrical interconnections and/or to the FPC laminate (see, e.g., FIG. 2D). Thus, it is desirable to heat these components uniformly to avoid generating significant temperature differences among the various pads.

Figure 2C:
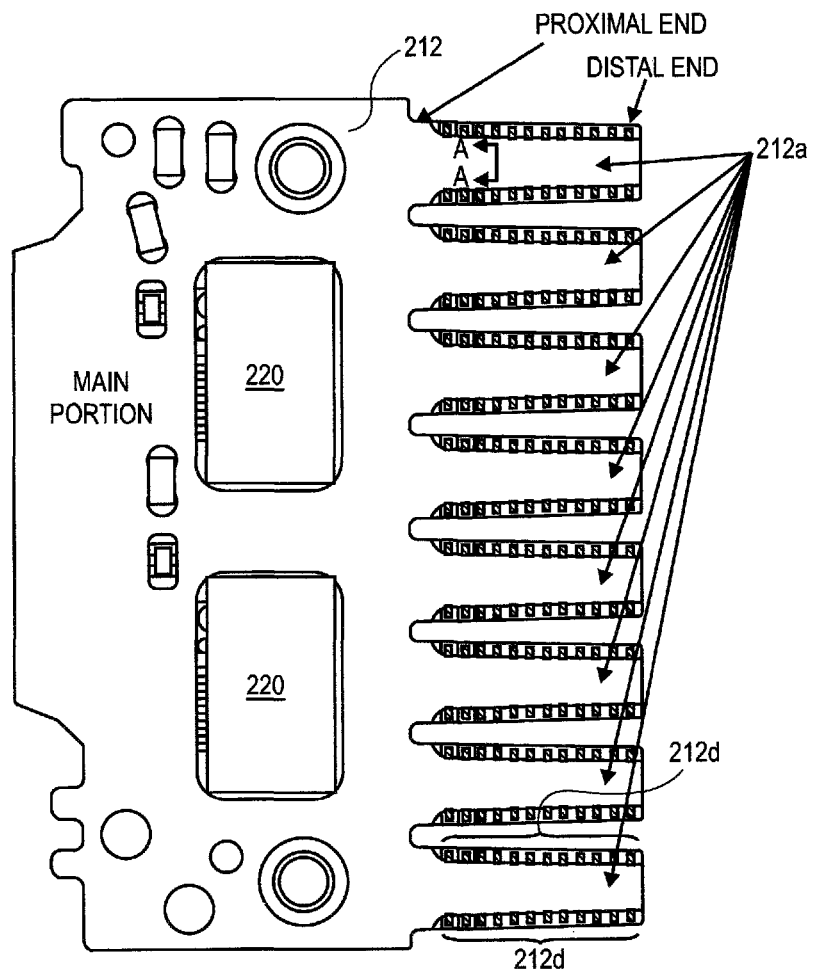
FIG. 2C is a plan view illustrating an FPC, according to an embodiment.

FIG. 2C is a plan view illustrating a flexible printed circuit, according to an embodiment. Here, FPC 212 comprises a plurality of FPC fingers 212a, each comprising a plurality of electrical pads 212d on each of the upper side and the lower side. Each FPC finger 212a typically services both an UP head (a read-write head facing upwards to service a bottom surface of a corresponding disk) and a DN head (a read-write head facing downwards to service a top surface of the same disk), electrically connecting each corresponding UP suspension and DN suspension to a preamp 220 (or beyond) mounted on the FPC 212. A cross-section of a FPC finger 212a is labeled A-A.

Figure 2D:
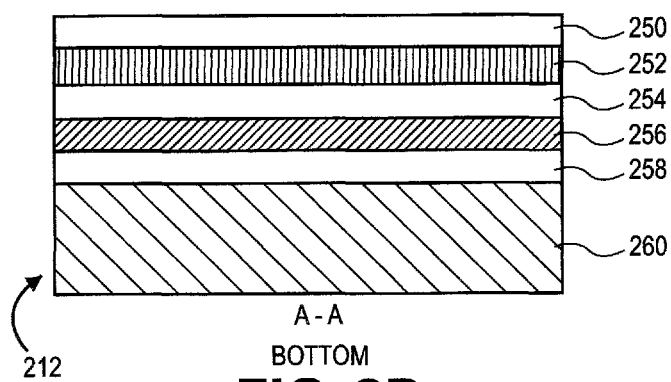
FIG. 2D is a cross-sectional view illustrating the FPC of FIG. 2C, according to an embodiment.

FIG. 2D is a cross-sectional view illustrating the FPC of FIG. 2C, according to an embodiment. Cross-sectional view A-A depicts the layers of an FPC such as FPC 212, comprising a base film 254 (e.g., a polyimide insulating layer) interposed between a top first wiring layer 252 (e.g., comprising copper traces) and a bottom second wiring layer 256 (e.g., comprising copper traces). The first wiring layer 252 is covered by a first cover film 250 (e.g., a polyimide insulating layer) and the second wiring layer 256 is covered by a second cover film 258 (e.g., a polyimide insulating layer). Finally, all of the foregoing layers are coupled with and supported by a bottom stiffener layer 260 (e.g., comprising aluminum, or some other stiff and durable material). The precise layout of FPC 212 may vary from implementation to implementation, so the layout of FIG. 2D is presented as one example. However, the techniques described herein are widely applicable to alternative FPC layouts having a metal (or otherwise thermally-conductive material) stiffener layer 260 (or simply "stiffener 260") underlying the wiring trace layers.

Offset Stiffener for Flexible Printed Circuit Finger

Figure 3A:
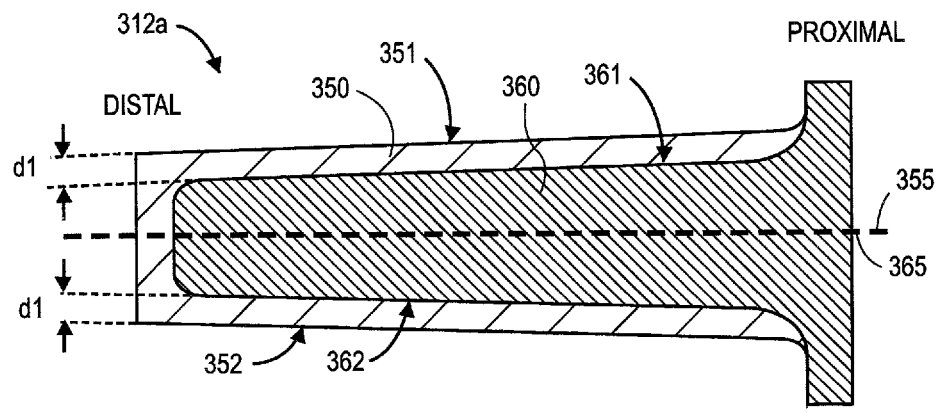
FIG. 3A is a plan view illustrating a symmetric FPC stiffener, according to an embodiment.

FIG. 3A is a plan view illustrating a symmetric FPC stiffener, according to an embodiment. Here, FPC finger 312a comprises a stiffener 360 that is symmetric with a corresponding cover film 350, as depicted by a single center line representing the superimposition of the cover film 350 centerline 355 superimposed with the stiffener 360 centerline 365. As described elsewhere herein, there may be a significant and undesirable temperature difference between some of the electrical pads 212d (FIGS. 2B-2C) and corresponding traces on the upper portion of the FPC finger 212a (FIGS. 2B, 2C) and some of the electrical pads 212d and corresponding traces on the lower portion of the FPC finger 212a, especially in non-limiting scenarios in which the FPC finger 212a pad layout is different for the UP and DN heads. There may also be a significant and undesirable temperature difference between some of the electrical pads 212d in either of the lines of pads servicing a respective UP or DN head.

Figure 3B:
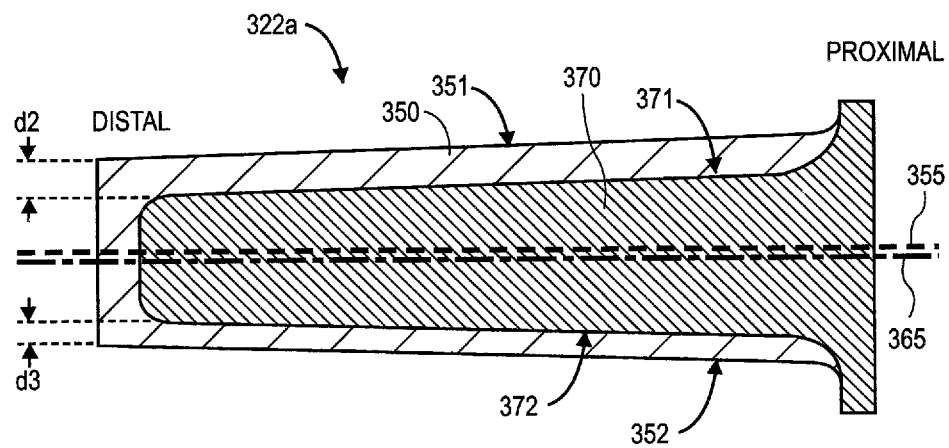
FIG. 3B is a plan view illustrating an offset FPC stiffener, according to an embodiment.

FIG. 3B is a plan view illustrating an offset FPC stiffener, according to an embodiment. According to this embodiment, to facilitate uniformity of temperature among different electrical pads, e.g., electrical pads 212d (FIGS. 2B-2C) of FPC 212 (FIGS. 2A-2D), the stiffener 370 of FPC finger 322a is shifted or offset from the centerline of the cover film 350. Stated otherwise, the stiffener 370 is formed and positioned to be asymmetric in relation to the cover film 350, as depicted by the cover film 350 centerline 355 no longer being superimposed with the stiffener 370 centerline 375. As such, because a thermally-conductive stiffener such as stiffener 370 inherently functions as a heat sink, the amount and location of heat transfer to the stiffener 370 (e.g., during the interconnection soldering procedure with the suspension tail tip 208e) on the top or upper side of the FPC finger 322a and on the bottom or lower side of the FPC finger 322a is now different, i.e., the lower electrical pads 212d become hotter due to the downward shift of the stiffener 370. Therefore, the overall temperature gradient between the top electrical pads 212d and the bottom electrical pads 212d can be reduced and the temperatures across the FPC finger 322a are generally more uniform.

With reference back to FIG. 3A, note that with the FPC finger 312a having a symmetric stiffener 360, the gap distance (d1) between the top edge 361 of the stiffener 360 and the top edge 351 of the cover film 350 is the same as the gap distance (d1) between the bottom edge 362 of the stiffener 360 and the bottom edge 352 of the cover film 350. By contrast, with reference to FIG. 3B, note that with the FPC finger 322a having the offset stiffener 370, the gap distance (d2) between the top edge 371 of the stiffener 370 and the top edge 351 of the cover film 350 is greater than the gap distance (d3) between the bottom edge 372 of the stiffener 370 and the bottom edge 352 of the cover film 350.

Note also that with the symmetric stiffener 360 of FIG. 3A, the top edge 361 of the stiffener 360 and the top edge 351 of the cover film 350 are parallel, and the bottom edge 362 of the stiffener 360 and the bottom edge 352 of the cover film 350 are also parallel. In a sense, the outline of the stiffener 360 is "nested" within the outline of the cover film 350. Likewise, with the asymmetric stiffener 370 of FIG. 3B, the top edge 371 of the stiffener 370 and the top edge 351 of the cover film 350 are parallel, and the bottom edge 372 of the stiffener 370 and the bottom edge 352 of the cover film 350 are also parallel.

Figure 4:
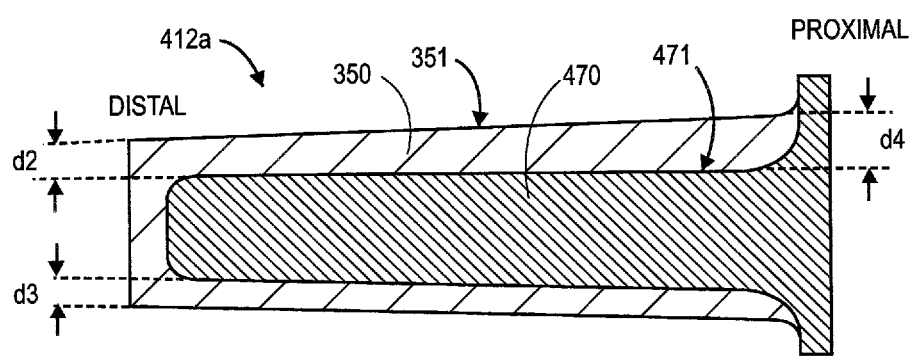
FIG. 4 is a plan view illustrating an offset FPC stiffener, according to an embodiment.

FIG. 4 is a front view illustrating an offset FPC stiffener, according to an embodiment. According to this embodiment, to facilitate uniformity of temperature among different electrical pads, e.g., electrical pads 212d (FIGS. 2B-2C) of FPC 212 (FIGS. 2A-2D), the top edge 471 of the stiffener 470 of an FPC finger 412a and the top edge 351 of the cover film 350 of the FPC finger 412a are intentionally formed to be convergent, or not parallel (non-parallel) to each other. Consequently, the gap distance between the top edge 471 of the stiffener 470 varies or tapers from a first gap distance (d2) at one end of the stiffener 470 to a second gap distance (d4) at the other end of the stiffener 470, where (d4) is greater than (d2). As such, because a thermally-conductive stiffener such as stiffener 470 inherently functions as a heat sink, the amount and location of heat transfer to the stiffener 470 (e.g., during the interconnection soldering procedure with the suspension tail tip 208e) on the top or upper side of the FPC finger 412a and on the bottom or lower side of the FPC finger 412a is now different, i.e., the lower electrical pads 212d become hotter due to the downward shift of the centroid of the stiffener 470. Therefore, the overall temperature gradient between the top electrical pads 212d and the bottom electrical pads 212d can be reduced and the temperatures across the FPC finger 412a are generally more uniform.

The embodiment of FIG. 3B and the embodiment of FIG. 4 may be implemented in combination, whereby the stiffener 470 is offset from the cover film 350 and the top edge 471 of the stiffener 470 is non-parallel with the top edge 351 of the cover film 350. In this case the gap distance (d2) of both FIG. 3B and FIG. 4 would be equivalent and the gap distance (d3) of both FIG. 3B and FIG. 4 would be equivalent, in conjunction with the additional non-parallel top edge 471 producing the second gap distance (d4). However, if the embodiment of FIG. 4 is implemented alone, the gap distance (d2) and the gap distance (d3) of FIG. 4 would be equivalent, whereas the non-parallel top edge 471 would still produce the second gap distance (d4). In all cases, the temperature difference between the top electrical pads 212d and the bottom electrical pads 212d can be reduced accordingly.

Figure 5A:
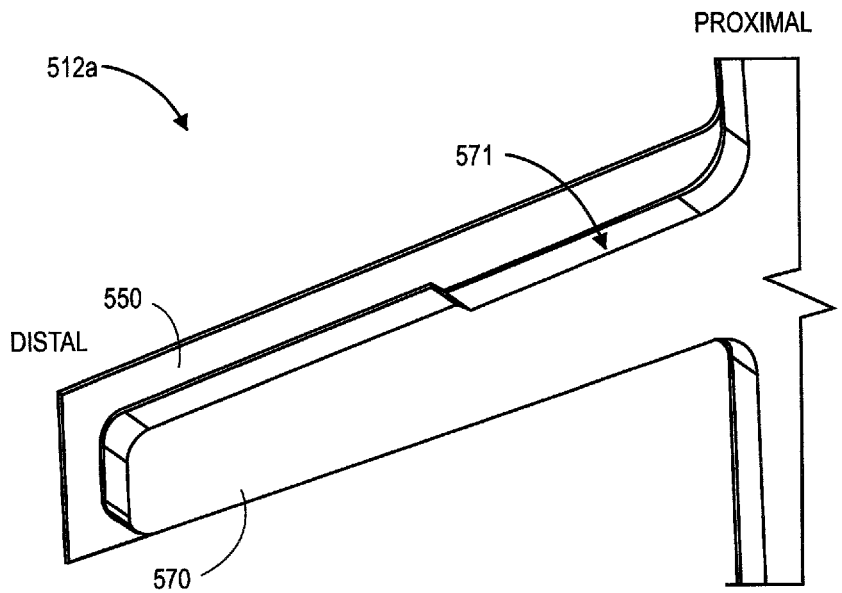
FIG. 5A is a perspective view illustrating an asymmetric FPC stiffener, according to an embodiment.
Figure 5B:
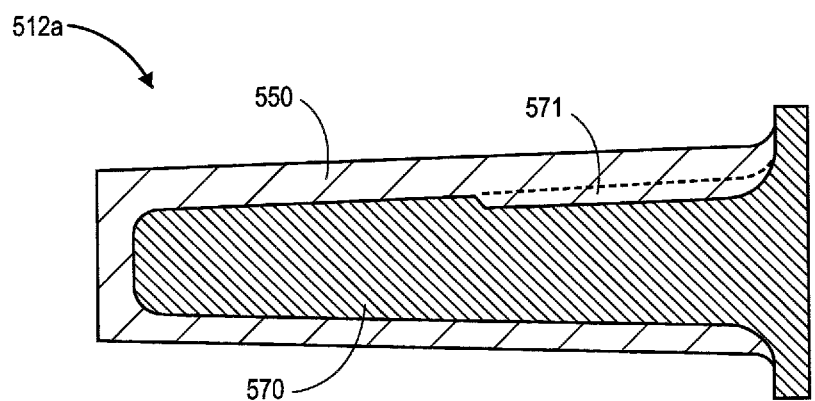
FIG. 5B is a plan view illustrating the asymmetric FPC stiffener of FIG. 5A, according to an embodiment.

FIG. 5A is a perspective view illustrating an asymmetric FPC stiffener, and FIG. 5B is a front view illustrating the asymmetric FPC stiffener of FIG. 5A, both according to an embodiment. According to this embodiment, to facilitate uniformity of temperature among different electrical pads, e.g., electrical pads 212d (FIGS. 2B-2C) of FPC 212 (FIGS. 2A-2D), the stiffener 570 of FPC finger 512a comprises a localized removal of material, or a cut-out 571. Here again, the stiffener 570 is formed to be asymmetric or to have a different shaped outline in relation to the cover film 550. As such, because a thermally-conductive stiffener such as stiffener 570 inherently functions as a heat sink, the amount and location of heat transfer to the stiffener 570 (e.g., during the interconnection soldering procedure with the suspension tail tip 208e) on the top or upper side of the FPC finger 512a and on the bottom or lower side of the FPC finger 512a is different, i.e., the lower electrical pads 212d become hotter due to the downward shift of the centroid of the stiffener 570. Therefore, the overall temperature gradient between the top electrical pads 212d and the bottom electrical pads 212d can be reduced and the temperatures across the FPC finger 512a are generally more uniform. The embodiment of FIG. 3B and/or the embodiment of FIG. 4, and the embodiment of FIGS. 5A-5B may be implemented in combination, whereby the stiffener 570 is offset from the cover film 550 and the cut-out 571 of stiffener 570 is applied. In all cases, the temperature difference between the top electrical pads 212d and the bottom electrical pads 212d can be reduced accordingly.

Note that the shape and placement of cut-out 571 of stiffener 570 may vary from implementation to implementation, based on specific design needs and goals with respect to the location of the temperature gradient that one wants to avoid or inhibit. That is, cut-out 571 may be positioned on either the top or the bottom side of stiffener 570, and/or cut-out 571 may be positioned more toward the narrower end rather than the thicker end of stiffener 570. Furthermore, use of the term "cut-out" is not intended to limit the manner in which the material void represented by cut-out 571 is formed, i.e., by a cutting process or even necessarily as a material removal process. Rather, the stiffener 570 may be formed (e.g., molded or extruded, etc.) from its source material having the material void in place. Still further, the shape of cut-out 571 depicted in FIG. 5A is for example purposes, as an actual shape implemented for a cut-out such as cut-out 571 may also vary from implementation to implementation depending, for example, on design needs and goals, manufacturing considerations, and the like.

Figure 6:
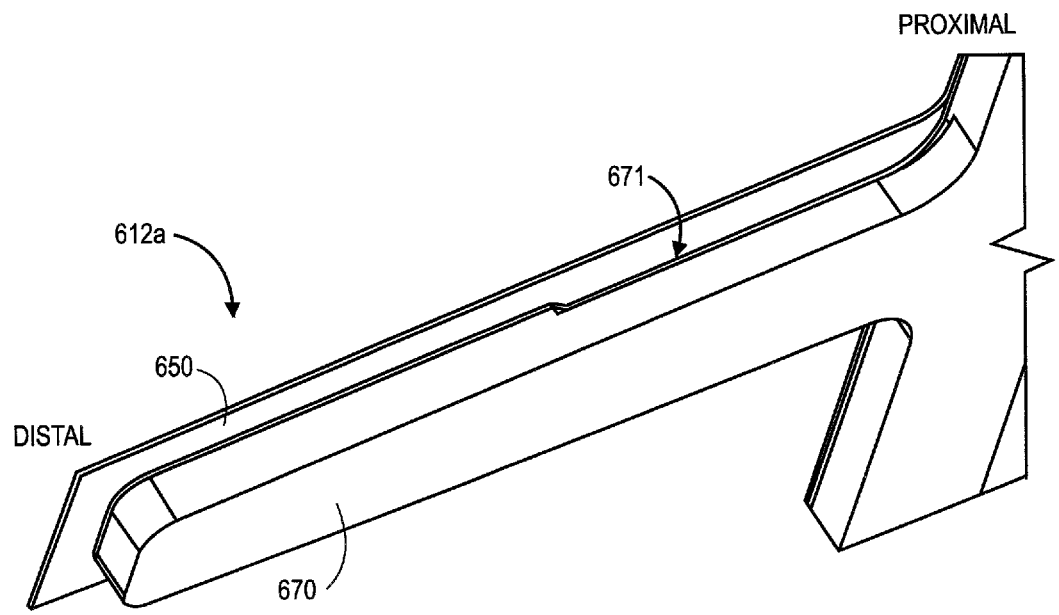
FIG. 6 is a perspective view illustrating an asymmetric FPC stiffener, according to an embodiment.

FIG. 6 is a perspective view illustrating an asymmetric FPC stiffener, according to an embodiment. According to this embodiment, to facilitate uniformity of temperature among different electrical pads, e.g., electrical pads 212*d* (FIGS. 2B-2C) of FPC 212 (FIGS. 2A-2D), the stiffener 670 of FPC finger 612*a* comprises a localized removal of material, or a cut-out 671. Here, the cut-out 671 does not span the entire thickness of stiffener 670, rather the material void is in an area closest to the cover film 650 (i.e., adjacent to the cover film, but for the other layers of the FPC 612*a* such as layers 252-258 of FIG. 2D) and extending in a direction away from the cover film 650 through only a portion of the thickness of the stiffener 670. This cut-out 671 may be formed by half-punching the source material of stiffener 670. Here again, the stiffener 670 is formed to be asymmetric or to have a different shaped outline in relation to the cover film 650. As such, because a thermally-conductive stiffener such as stiffener 670 inherently functions as a heat sink, the amount and location of heat transfer to the stiffener 670 (e.g., during the interconnection soldering procedure with the suspension tail tip 208*e*) on the top or upper side of the FPC finger 612*a* and on the bottom or lower side of the FPC finger 612*a* is different, i.e., the lower electrical pads 212*d* become hotter due to the downward shift of the centroid of the stiffener 670. Therefore, the overall temperature gradient between the top electrical pads 212*d* and the bottom electrical pads 212*d* can be reduced and the temperatures across the FPC finger 612*a* are generally more uniform. The embodiment of FIG. 3B and/or the embodiment of FIG. 4, and the embodiment of FIG. 6 may be implemented in combination, whereby the stiffener 670 is offset from the cover film 650 and the cut-out 671 of stiffener 670 is applied. In all cases, the temperature difference between the top electrical pads 212*d* and the bottom electrical pads 212*d* can be reduced accordingly.

Note that the shape and placement of cut-out 671 of stiffener 670 may vary from implementation to implementation, based on specific design needs and goals with respect to the location of the temperature gradient that one wants to avoid or inhibit. That is, cut-out 671 may be positioned on either the top or the bottom side of stiffener 670, and/or cut-out 671 may be positioned more toward the narrower end rather than the thicker end of stiffener 670. Furthermore, use of the term "cut-out" is not intended to limit the manner in which the material void represented by cut-out 671 is formed, i.e., by a cutting process or even necessarily as a material removal process. Rather, the stiffener 670 may be formed (e.g., molded or extruded, etc.) from its source material having the material void in place. Still further, the shape of cut-out 671 depicted in FIG. 6 is for example purposes, as an actual shape implemented for a cut-out such as cut-out 671 may also vary from implementation to implementation depending, for example, on design needs and goals, manufacturing considerations, and the like.

Figure 7:
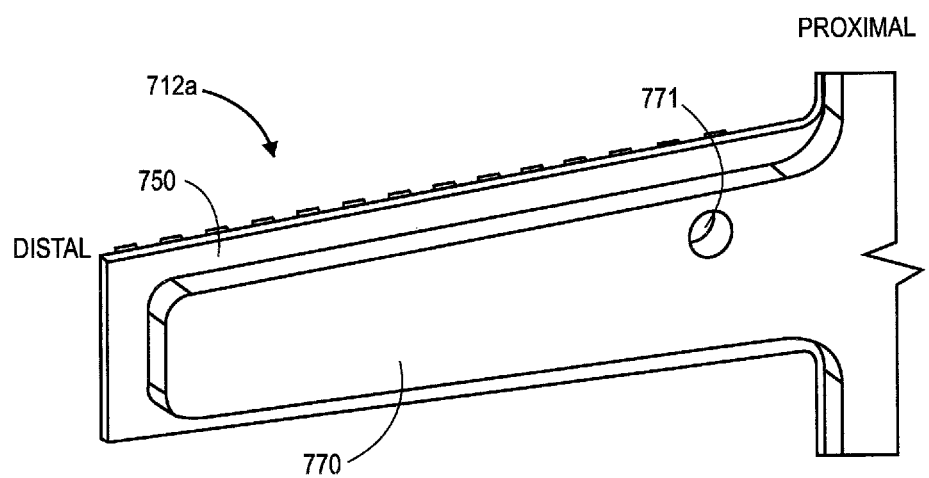
FIG. 7 is a perspective view illustrating an asymmetric FPC stiffener, according to an embodiment.

FIG. 7 is a perspective view illustrating an asymmetric FPC stiffener, according to an embodiment. According to this embodiment, to facilitate uniformity of temperature among different electrical pads, e.g., electrical pads 212*d* (FIGS. 2B-2C) of FPC 212 (FIGS. 2A-2D), the stiffener 770 of FPC finger 712*a* comprises a localized removal of material, or a hole 771 therethrough. Here, the hole 771 may span the entire thickness of stiffener 770, or may just be localized to an area closest to the cover film 750 and extending in a direction away from the cover film 750 through only a portion of the thickness of the stiffener 770. As such, because a thermally-conductive stiffener such as stiffener 770 inherently functions as a heat sink, the amount and location of heat transfer to the stiffener 770 (e.g., during the interconnection soldering procedure with the suspension tail tip 208*e*) on the top or upper side of the FPC finger 712*a* and on the bottom or lower side of the FPC finger 712*a* is different, i.e., the lower electrical pads 212*d* become hotter due to the downward shift of the centroid of the stiffener 770. Therefore, the overall temperature gradient between the top electrical pads 212*d* and the bottom electrical pads 212*d* can be reduced and the temperatures across the FPC finger 712*a* are generally more uniform. The embodiment of FIG. 3B and/or the embodiment of FIG. 4, and the embodiment of FIG. 7 may be implemented in combination, whereby the stiffener 770 is offset from the cover film 750 and the hole 771 of stiffener 770 is applied. In all cases, the temperature difference between the top electrical pads 212*d* and the bottom electrical pads 212*d* can be reduced accordingly. Note that the placement of hole 771 of stiffener 770 may vary from implementation to implementation, based on specific design needs and goals with respect to the location of the temperature gradient that one wants to avoid or inhibit. That is, hole 771 may be positioned on either the top or the bottom side of stiffener 770, and/or hole 771 may be positioned more toward the narrower end rather than the thicker end of stiffener 770.

Summarily, the foregoing embodiments each characterizes a shift in the center of mass (e.g., centroid) of the FPC stiffener 370 (FIG. 3B), 470 (FIG. 4), 570 (FIGS. 5A-5B), 670 (FIG. 6), 770 (FIG. 7) relative to the centerline or centroid of the corresponding cover film 350 (FIGS. 3B, 4), 550 (FIG. 5A-5B), 650 (FIG. 6), 750 (FIG. 7), employing the various described techniques alone or in combination. Hence, temperature differences between top electrical pads 212*d* (FIG. 2D) and bottom electrical pads 212*d* due to the heat-based interconnection procedure (e.g., soldering) can be consequently reduced, damage to the FPC prevented, and soldering yields improved. Generally, the temperatures across a given FPC finger are made more uniform.

Method for Manufacturing a Flexible Printed Circuit

Figure 8:
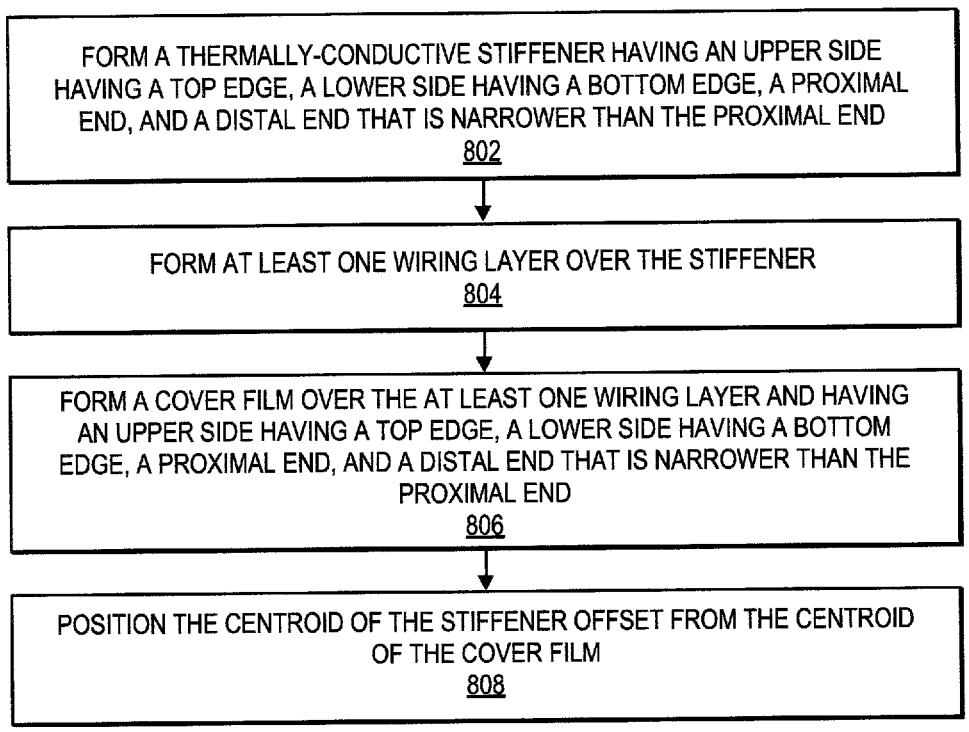
FIG. 8 is a flowchart illustrating a method for manufacturing a flexible printed circuit (FPC) laminate composition, according to an embodiment.

FIG. 8 is a flowchart illustrating a method for manufacturing a flexible printed circuit (FPC) laminate composition, according to an embodiment.

At block 802, a thermally-conductive stiffener is formed, having a top or upper side or portion having a top edge, a bottom or lower side or portion having a bottom edge, a proximal end, and a distal end that is narrower than the proximal end. For example, an FPC stiffener 260 (FIG. 2D), 370 (FIG. 3B), 470 (FIG. 4), 570 (FIGS. 5A- 5B), 670 (FIG. 6), 770 (FIG. 7) is formed of a thermally-conductive material, such as aluminum for a non-limiting example.

At block 804, at least one wiring layer is formed over the stiffener. For example, the first wiring layer 252 (FIG. 2D) and the second wiring layer 256 (FIG. 2D) are formed over the FPC stiffener 260, 370, 470, 570, 670, 770, such as by etching a copper layer for a non-limiting example.

At block 806, a cover film is formed over the at least one wiring layer, having a top or upper side or portion having a top edge, a bottom or lower side or portion having a bottom edge, a proximal end, and a distal end that is narrower than the proximal end. For example, cover film 250 (FIG. 2D), 350 (FIGS. 3B, 4), 550 (FIG. 5A- 5B), 650 (FIG. 6), 750 (FIG. 7) is formed over the first and second wiring layers 252, 256.

At block 808, the centroid of the stiffener is positioned offset from the centerline of the cover film. For example, the centroid of FPC stiffener 370 is shifted or offset downward by asymmetric positioning of the stiffener 370 relative to the centerline of the cover film 350. For example, the centroid of FPC stiffener 470 is shifted or offset downward by asymmetric shaping of the stiffener 470 relative to the centerline of the cover film 350. For example, the centroid of FPC stiffener 570 is shifted or offset downward via the cut-out 571 of the stiffener 570 relative to the centerline of the cover film 550. For example, the centroid of FPC stiffener 670 is shifted or offset downward via the partial cut-out 671 of the stiffener 670 relative to the centerline of the cover film 650. For example, the centroid of FPC stiffener 770 is shifted or offset downward via the hole 771 of the stiffener 770 relative to the centerline of the cover film 750.

Physical Description of an Illustrative Operating Context

Embodiments may be used in the context of a digital data storage device (DSD) such as a hard disk drive (HDD). Thus, in accordance with an embodiment, a plan view illustrating a conventional HDD 100 is shown in FIG. 1 to aid in describing how a conventional HDD typically operates.

FIG. 1 illustrates the functional arrangement of components of the HDD 100 including a slider 110b that includes a magnetic read-write head 110a. Collectively, slider 110b and head 110a may be referred to as a head slider. The HDD 100 includes at least one head gimbal assembly (HGA) 110 including the head slider, a lead suspension 110c attached to the head slider typically via a flexure, and a load beam 110d attached to the lead suspension 110c. The HDD 100 also includes at least one recording medium 120 rotatably mounted on a spindle 124 and a drive motor (not visible) attached to the spindle 124 for rotating the medium 120. The read-write head 110a, which may also be referred to as a transducer, includes a write element and a read element for respectively writing and reading information stored on the medium 120 of the HDD 100. The medium 120 or a plurality of disk media may be affixed to the spindle 124 with a disk clamp 128.

The HDD 100 further includes an arm 132 attached to the HGA 110, a carriage 134, a voice-coil motor (VCM) that includes an armature 136 including a voice coil 140 attached to the carriage 134 and a stator 144 including a voice-coil magnet (not visible). The armature 136 of the VCM is attached to the carriage 134 and is configured to move the arm 132 and the HGA 110 to access portions of the medium 120, all collectively mounted on a pivot shaft 148 with an interposed pivot bearing assembly 152. In the case of an HDD having multiple disks, the carriage 134 may be referred to as an "E-block," or comb, because the carriage is arranged to carry a ganged array of arms that gives it the appearance of a comb.

An assembly comprising a head gimbal assembly (e.g., HGA 110) including a flexure to which the head slider is coupled, an actuator arm (e.g., arm 132) and/or load beam to which the flexure is coupled, and an actuator (e.g., the VCM) to which the actuator arm is coupled, may be collectively referred to as a head-stack assembly (HSA). An HSA may, however, include more or fewer components than those described. For example, an HSA may refer to an assembly that further includes electrical interconnection components. Generally, an HSA is the assembly configured to move the head slider to access portions of the medium 120 for read and write operations.

With further reference to FIG. 1, electrical signals (e.g., current to the voice coil 140 of the VCM) comprising a write signal to and a read signal from the head 110a, are transmitted by a flexible cable assembly (FCA) 156 (or "flex cable", or "flexible printed circuit" (FPC)). Interconnection between the flex cable 156 and the head 110a may include an arm-electronics (AE) module 160, which may have an on-board pre-amplifier for the read signal, as well as other read-channel and write-channel electronic components. The AE module 160 may be attached to the carriage 134 as shown. The flex cable 156 may be coupled to an electrical-connector block 164, which provides electrical communication, in some configurations, through an electrical feed-through provided by an HDD housing 168. The HDD housing 168 (or "enclosure base" or "baseplate" or simply "base"), in conjunction with an HDD cover, provides a semi-sealed (or hermetically sealed, in some configurations) protective enclosure for the information storage components of the HDD 100.

Other electronic components, including a disk controller and servo electronics including a digital-signal processor (DSP), provide electrical signals to the drive motor, the voice coil 140 of the VCM and the head 110a of the HGA 110. The electrical signal provided to the drive motor enables the drive motor to spin providing a torque to the spindle 124 which is in turn transmitted to the medium 120 that is affixed to the spindle 124. As a result, the medium 120 spins in a direction 172. The spinning medium 120 creates a cushion of air that acts as an air-bearing on which the air-bearing surface (ABS) of the slider 110b rides so that the slider 110b flies above the surface of the medium 120 without making contact with a thin magnetic-recording layer in which information is recorded. Similarly in an HDD in which a lighter-than-air gas is utilized, such as helium for a non-limiting example, the spinning medium 120 creates a cushion of gas that acts as a gas or fluid bearing on which the slider 110b rides.

The electrical signal provided to the voice coil 140 of the VCM enables the head 110a of the HGA 110 to access a track 176 on which information is recorded. Thus, the armature 136 of the VCM swings through an arc 180, which enables the head 110a of the HGA 110 to access various tracks on the medium 120. Information is stored on the medium 120 in a plurality of radially nested tracks arranged in sectors on the medium 120, such as sector 184. Correspondingly, each track is composed of a plurality of sectored track portions (or "track sector") such as sectored track portion 188. Each sectored track portion 188 may include recorded information, and a header containing error correction code information and a servo-burst-signal pattern, such as an ABCD-servo-burst-signal pattern, which is information that identifies the track 176. In accessing the track 176, the read element of the head 110a of the HGA 110 reads the servo-burst-signal pattern, which provides a position-error-signal (PES) to the servo electronics, which controls the electrical signal provided to the voice coil 140 of the VCM, thereby enabling the head 110a to follow the track 176. Upon finding the track 176 and identifying a particular sectored track portion 188, the head 110a either reads information from the track 176 or writes information to the track 176 depending on instructions received by the disk controller from an external agent, for example, a microprocessor of a computer system.

An HDD's electronic architecture comprises numerous electronic components for performing their respective functions for operation of an HDD, such as a hard disk controller ("HDC"), an interface controller, an arm electronics module, a data channel, a motor driver, a servo processor, buffer memory, etc. Two or more of such components may be combined on a single integrated circuit board referred to as a "system on a chip" ("SOC"). Several, if not all, of such electronic components are typically arranged on a printed circuit board that is coupled to the bottom side of an HDD, such as to HDD housing 168.

References herein to a hard disk drive, such as HDD 100 illustrated and described in reference to FIG. 1, may encompass an information storage device that is at times referred to as a "hybrid drive". A hybrid drive refers generally to a storage device having functionality of both a traditional HDD (see, e.g., HDD 100) combined with solid-state storage device (SSD) using non-volatile memory, such as flash or other solid-state (e.g., integrated circuits) memory, which is electrically erasable and programmable. As operation, management and control of the different types of storage media typically differ, the solid-state portion of a hybrid drive may include its own corresponding controller functionality, which may be integrated into a single controller along with the HDD functionality. A hybrid drive may be architected and configured to operate and to utilize the solid-state portion in a number of ways, such as, for non-limiting examples, by using the solid-state memory as cache memory, for storing frequently-accessed data, for storing I/O intensive data, and the like. Further, a hybrid drive may be architected and configured essentially as two storage devices in a single enclosure, i.e., a traditional HDD and an SSD, with either one or multiple interfaces for host connection.

EXTENSIONS AND ALTERNATIVES

In the foregoing description, embodiments of the invention have been described with reference to numerous specific details that may vary from implementation to implementation. Therefore, various modifications and changes may be made thereto without departing from the broader spirit and scope of the embodiments. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

In addition, in this description certain process steps may be set forth in a particular order, and alphabetic and alphanumeric labels may be used to identify certain steps. Unless specifically stated in the description, embodiments are not necessarily limited to any particular order of carrying out such steps. In particular, the labels are used merely for convenient identification of steps, and are not intended to specify or require a particular order of carrying out such steps.

What is claimed is:

1. A flexible printed circuit (FPC) comprising:
   a plurality of fingers extending from a main portion, each finger comprising:
      a thermally-conductive stiffener having an upper side having a top edge, a lower side having a bottom edge, a proximal end, and a distal end that is narrower than the proximal end,
      at least one wiring layer over the stiffener, and
      a cover film over the at least one wiring layer and having an upper side having a top edge, a lower side having a bottom edge, a proximal end, and a distal end that is narrower than the proximal end;
   wherein the centroid of the stiffener is offset from the centerline of the cover film.

2. The FPC of claim 1, wherein the centroid of the stiffener is offset from the centerline of the cover film in a direction transverse to the upper and lower sides of the cover film.

3. The FPC of claim 2, wherein at least one of the top edge and the bottom edge of the stiffener is formed non-parallel with a corresponding at least one of the top edge or the bottom edge of the cover film.

4. The FPC of claim 3, wherein at least one of the top edge and the bottom edge of the stiffener comprises a material void forming a non-linear shape to the at least one edge.

5. The FPC of claim 1, wherein at least one of the top edge and the bottom edge of the stiffener is formed non-parallel with a corresponding at least one of the top edge or the bottom edge of the cover film.

6. The FPC of claim 1, wherein at least one of the top edge and the bottom edge of the stiffener comprises a material void forming a non-linear shape to the at least one edge.

7. The FPC of claim 1, wherein at least one of the top edge and the bottom edge of the stiffener is formed having a material void in an area closest to the cover film and extending in a direction away from the cover film through only a portion of a thickness of the stiffener.

8. The FPC of claim 1, wherein the stiffener further comprises a hole to inhibit heat transfer to the stiffener at the location of the hole.

9. A hard disk drive comprising the FPC of claim 1.

10. A method for manufacturing a flexible printed circuit (FPC) laminate composition having a plurality of fingers, the method comprising:
    forming a thermally-conductive stiffener having an upper side having a top edge, a lower side having a bottom edge, a proximal end, and a distal end that is narrower than the proximal end;
    forming at least one wiring layer over the stiffener;
    forming a cover film over the at least one wiring layer and having an upper side having a top edge, a lower side having a bottom edge, a proximal end, and a distal end that is narrower than the proximal end; and
    positioning the centroid of the stiffener offset from the centerline of the cover film.

11. The method of claim 10, wherein the positioning includes positioning the centroid of the stiffener offset from the centerline of the cover film in a direction transverse to the upper and lower sides of the cover film.

12. The method of claim 11, wherein forming the stiffener includes forming at least one of the top edge and the bottom edge of the stiffener non-parallel to the other of the top edge and the bottom edge of the stiffener and non-parallel with a corresponding at least one of the top edge or the bottom edge of the cover film.

13. The method of claim 12, wherein forming the stiffener includes forming at least one of the top edge and the bottom edge of the stiffener with a material void forming a non-linear shape to the at least one edge.

14. The method of claim 10, wherein forming the stiffener includes forming at least one of the top edge and the bottom edge of the stiffener non-parallel to the other of the top edge and the bottom edge of the stiffener and non-parallel with a corresponding at least one of the top edge or the bottom edge of the cover film.

15. The method of claim 10, wherein forming the stiffener includes forming at least one of the top edge and the bottom edge of the stiffener with a material void forming a non-linear shape to the at least one edge.

16. The method of claim 10, wherein forming the stiffener includes forming at least one of the top edge and the bottom edge of the stiffener having a material void in an area closest to the cover film and extending in a direction away from the cover film through only a portion of a thickness of the stiffener.

17. The method of claim 10, wherein forming the stiffener includes forming the stiffener further comprising a hole to inhibit heat conductivity to the stiffener at the location of the hole.

18. A hard disk drive (HDD) comprising:
- a plurality of recording media rotatably mounted on a spindle;
- a plurality of head sliders each housing a respective read-write transducer configured to read from and to write to at least one recording media of the plurality of recording media;
- an actuator configured to move the plurality of head sliders to access portions of the at least one recording media;
- means for transmitting electrical signals to and from a respective head slider of the plurality of head sliders; and
- a flexible printed circuit (FPC) electrically connected to the means for transmitting electrical signals, the FPC comprising:
  - a plurality of fingers extending from a main portion, each finger comprising:
    - a thermally-conductive stiffener having an upper side having a top edge, a lower side having a bottom edge, a proximal end, and a distal end that is narrower than the proximal end,
    - at least one wiring layer over the stiffener, and
    - a cover film over the at least one wiring layer and having an upper side having a top edge, a lower side having a bottom edge, a proximal end, and a distal end that is narrower than the proximal end,
  - wherein the centroid of the stiffener is offset from the centerline of the cover film in a direction transverse to the upper and lower sides of the cover film.

19. The HDD of claim 18, wherein at least one of the top edge and the bottom edge of the stiffener is formed non-parallel with a corresponding at least one of the top edge or the bottom edge of the cover film.

20. The HDD of claim 18, wherein at least one of the top edge and the bottom edge of the stiffener is formed having a material void in an area closest to the cover film and extending in a direction away from the cover film through at least a portion of a thickness of the stiffener.

* * * * *